(12) United States Patent
Lee

(10) Patent No.: US 7,057,227 B2
(45) Date of Patent: Jun. 6, 2006

(54) GATE STRUCTURE IN FLASH MEMORY CELL AND METHOD OF FORMING THE SAME, AND METHOD OF FORMING DIELECTRIC FILM

(75) Inventor: Sung Hoon Lee, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 177 days.

(21) Appl. No.: 10/315,253

(22) Filed: Dec. 10, 2002

(65) Prior Publication Data
US 2004/0012048 A1    Jan. 22, 2004

(30) Foreign Application Priority Data
Jul. 18, 2002    (KR) .................. 10-2002-0042150

(51) Int. Cl.
*H01L 29/76*    (2006.01)
(52) U.S. Cl. .................... 257/314; 257/316; 257/309
(58) Field of Classification Search ................ 257/309, 257/314–315, 317
See application file for complete search history.

(56) References Cited

U.S. PATENT DOCUMENTS

| | | | |
|---|---|---|---|
| 5,679,970 A * | 10/1997 | Hartmann | 257/320 |
| 5,981,338 A * | 11/1999 | Lee | 438/257 |
| 6,133,095 A * | 10/2000 | Eitan et al. | 438/261 |
| 6,229,175 B1 * | 5/2001 | Uchida | 257/315 |
| 6,255,156 B1 * | 7/2001 | Forbes et al. | 438/235 |
| 6,259,130 B1 * | 7/2001 | Wu | 257/314 |
| 6,265,263 B1 * | 7/2001 | Wu | 438/255 |
| 6,287,915 B1 * | 9/2001 | Muramatsu | 438/257 |
| 6,548,348 B1 * | 4/2003 | Ni et al. | 438/253 |
| 6,784,057 B1 * | 8/2004 | Nishioka | 438/258 |
| 2001/0022377 A1* | 9/2001 | Chan et al. | 257/321 |
| 2003/0096477 A1* | 5/2003 | Bez et al. | 438/257 |

FOREIGN PATENT DOCUMENTS

| | | | |
|---|---|---|---|
| JP | 61-268043 | * | 11/1986 |
| JP | 11-111872 | * | 4/1999 |

* cited by examiner

*Primary Examiner*—Nathan J. Flynn
*Assistant Examiner*—Ahmed N. Sefer
(74) *Attorney, Agent, or Firm*—Mayer, Brown, Rowe & Maw LLP

(57) ABSTRACT

The present invention relates to a gate structure of a flash memory cell and method of forming the same, and method of forming a dielectric film. The method of forming the dielectric film in the flash memory cell comprises the steps of preparing a wafer including a tunnel oxide film formed in a given region of a semiconductor substrate, a polysilicon film formed on the tunnel oxide film, and an oxide film and a silicon nitride film formed on the polysilicon film; preparing a work cell in which a voltage is applied to the rear side of the semiconductor substrate used as a work electrode in which the silicon nitride film is formed, a relative electrode and a reference electrode are kept by a given distance so that they can be immersed in electrolyte, and in which an ultraviolet rays source is formed on an upper side to illuminate an ultraviolet rays to a work electrode; and performing electro-chemical etch using silicon dissociation reaction for the wafer mounted on the work cell to form porosities in the silicon nitride film.

9 Claims, 3 Drawing Sheets

GATE STRUCTURE IN FLASH MEMORY CELL AND METHOD OF FORMING THE SAME, AND METHOD OF FORMING DIELECTRIC FILM

BACKGROUND OF THE INVENTION

1. Field of the Invention

The invention relates generally to a semiconductor device and a method of manufacturing the same, and more particularly to, a gate structure in a flash memory cell and a method of forming the same, and a method of forming a dielectric film.

2. Description of the Prior Art

An ONO dielectric film of the flash memory device, i.e., a dielectric film of a structure on which an oxide film, a silicon nitride film and an oxide film are sequentially stacked, is used as an insulating film between a floating gate for storing data when the memory device is driven and a control gate. Meanwhile, methods for increasing the coupling ratio include increasing an electrode area of the floating gate, reducing a thickness of the insulating film between the floating gate and the control gate, and using the dielectric film of a high dielectric constant. In DRAM (dynamic random access memory) devices, in case of the capacitor, the electrode area of the capacitor could be increased by applying a 3-dimensional structure of a cylinder shape or a pin shape to the capacitor. On the other hand, in case of the flash memory device, there is a structural problem that the 3-dimensional structure is difficult to be applied to the floating gate. Currently, the method of reducing the thickness of the dielectric film reaches a limitation in reducing the thickness. Also, in case of the method of using the dielectric film of a high dielectric constant, there is a problem that a new dielectric material must be developed.

SUMMARY OF THE INVENTION

The present invention is contrived to solve the above problems and an object of the present invention is to provide a gate structure in a flash memory cell capable of increasing the program and erase rate by increasing the coupling ratio and having a multi capacitor structure.

Another object of the present invention is to provide a method of forming a gate in the flash memory cell capable of increasing the coupling ratio by increasing the cross section of an ONO insulating film.

Still another object of the present invention is to provide a method of forming a dielectric film in the flash memory cell by which the dielectric film is electro-chemically processed to form porosities.

In order to accomplish the above object, a gate structure in a flash memory cell according to the present invention, is characterized in that it comprises a tunnel oxide film in a given region of a semiconductor substrate, a first floating gate formed on the tunnel oxide film, a first dielectric film having porosities, formed on the first floating gate, a second floating gate having a rugged surface, wherein the second floating gate is formed on the first dielectric film having the porosities, a second dielectric film formed along the rugged surface on the second floating gate, and a control gate formed on the second dielectric film.

In order to accomplish another object, a method of forming a gate in the flash memory cell according to the present invention, is characterized in that it comprises the steps of forming a tunnel oxide film in a given region of a semiconductor substrate, forming a first floating gate on the tunnel oxide film, sequentially forming an oxide film and a silicon nitride film on the first floating gate, performing electro-chemical etch to form porosities in the silicon nitride film on the first floating gate, forming a second floating gate having a rugged surface on the resulting surface, forming a second dielectric film along the rugged surface on the second floating gate, and forming a control gate on the second dielectric film.

In order to accomplish still another object, a method of forming a dielectric film in the flash memory cell according to the present invention, is characterized in that it comprises the steps of preparing a wafer including a tunnel oxide film formed in a given region of a semiconductor substrate, a polysilicon film formed on the tunnel oxide film, and an oxide film and a silicon nitride film formed on the polysilicon film; preparing a work cell in which a voltage is applied to the rear side of the semiconductor substrate used as a work electrode in which the silicon nitride film is formed, a relative electrode and a reference electrode are kept by a given distance so that they can be immersed in electrolyte, and in which an ultraviolet rays source is formed on an upper side to illuminate an ultraviolet rays to a work electrode; and performing electro-chemical etch using silicon dissociation reaction for the wafer mounted on the work cell to form porosities in the silicon nitride film.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
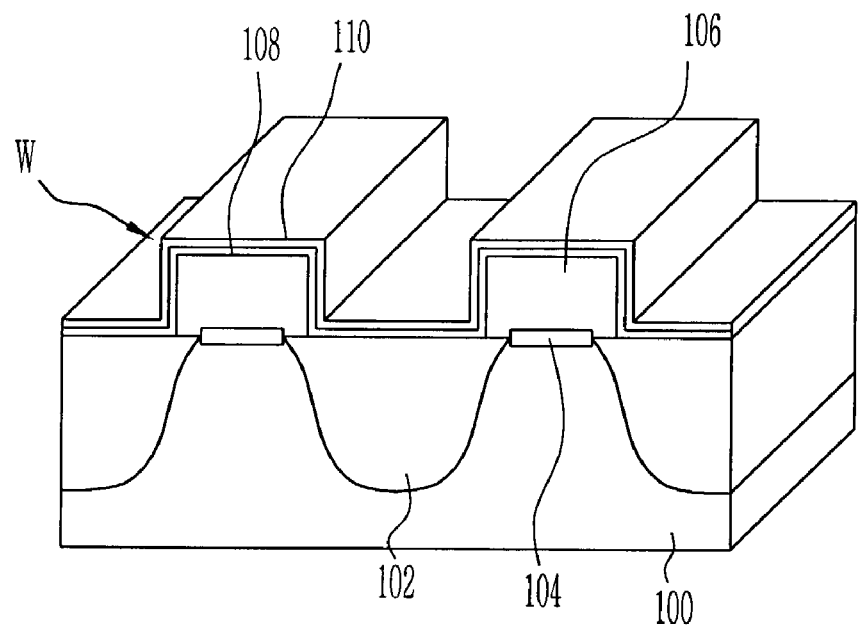
FIG. 1 shows a wafer for which electro-chemical etch will be performed.

The present invention will be described in detail by way of a preferred embodiment with reference to accompanying drawings, in which like reference numerals are used to identify the same or similar parts.

In the following description, though it will be described that one layer is located on the other layer, it should be noted that one layer may exist immediately on the other layer or a third layer may be intervened between the two layers. Further, it should be noted that the thickness and size of each of the layers are exaggerated in the drawings for convenience of explanation and clarity.

The present invention presents a gate structure in a flash memory cell, a method of forming a gate, a method of forming a dielectric film and an electro-chemical etch apparatus, in a way that maximization of an electrode area can be implemented by forming porosities through electro-chemical etch process in order to increase the coupling ratio of the flash memory device, and a thickness of an oxide film between a floating gate and a control gate can be reduced to increase capacitance by using the oxide film on the surface of an insulating film generating during the electro-chemical etch process.

Figure 2:
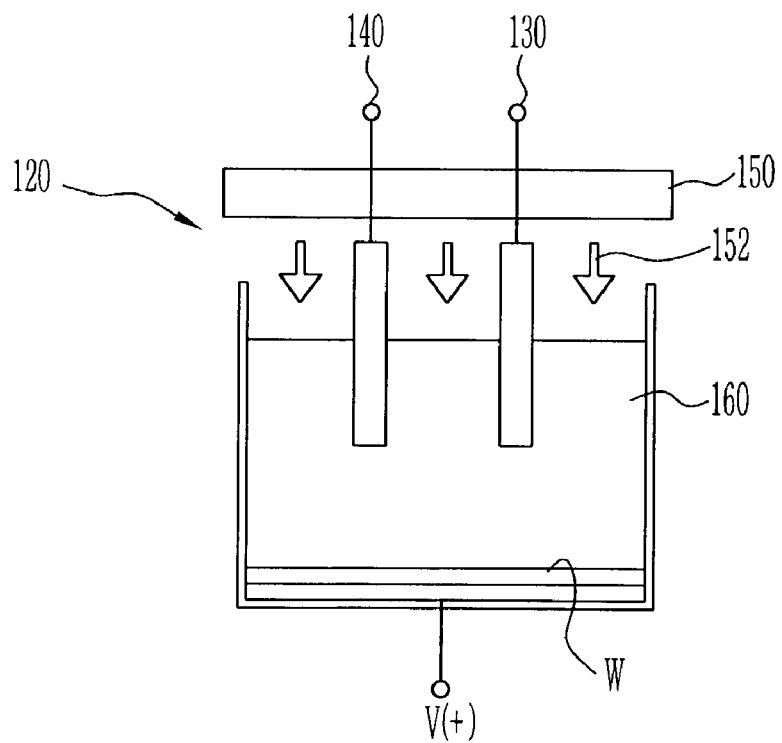
FIG. 2 shows a work cell for which electro-chemical etch will be performed according to a preferred embodiment of the present invention.
Figure 3A:
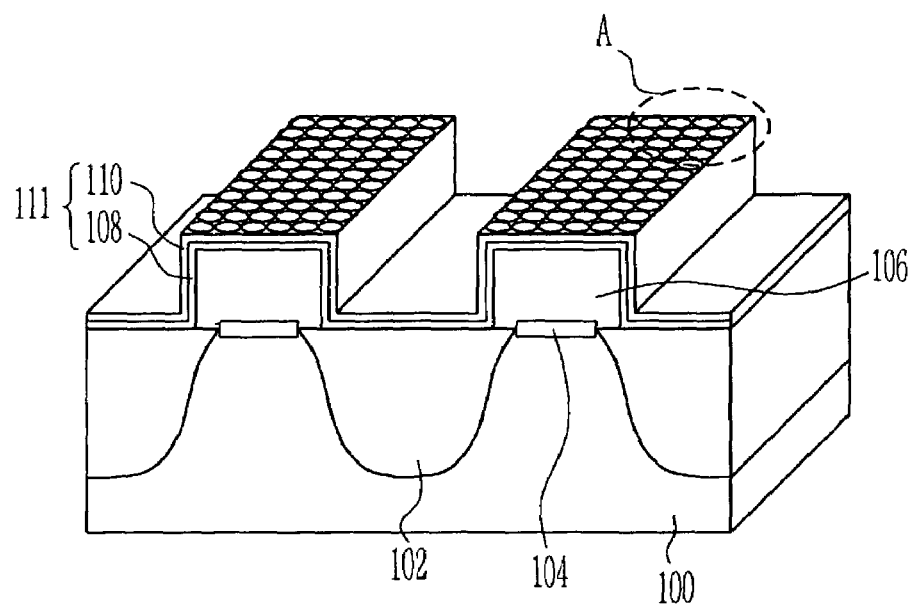
FIG. 3A and FIG. 3B illustrate flash memory cells where the porosities are formed in a dielectric film by electro-chemical etch according to a preferred embodiment of the present invention.
Figure 3B:
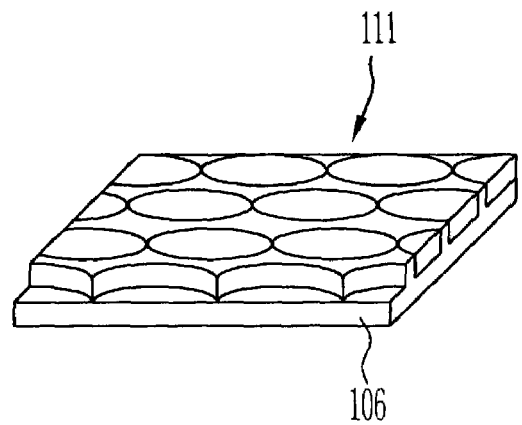
Figure 4:
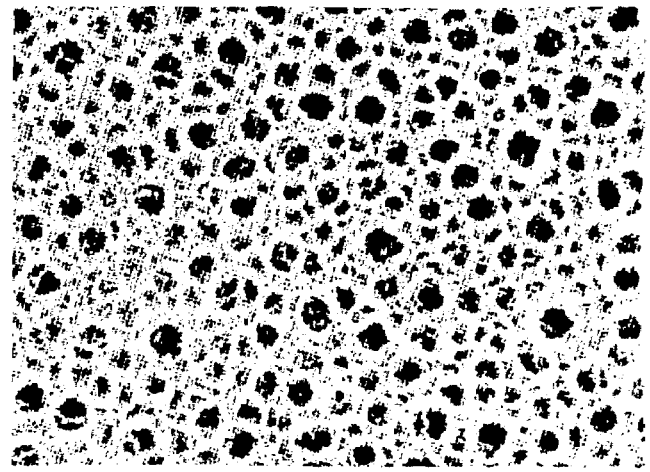
FIG. 4 is a SEM (scanning electron microscope) photolithography showing that the porosities are formed in the dielectric film by means of electro-chemical etch.

FIG. 1 shows a wafer for which electro-chemical etch will be performed. FIG. 2 shows a work cell for which electro-chemical etch will be performed according to a preferred embodiment of the present invention. FIG. 3A and FIG. 3B illustrate flash memory cells where the porosities are formed in the dielectric film by means of electro-chemical etch according to a preferred embodiment of the present invention, wherein FIG. 3B is an exaggerated drawing of the 'A' portion in FIG. 3A. FIG. 4 is a SEM (scanning electron microscope) photolithography showing that the porosities are formed in the dielectric film by means of electro-chemical etch.

Referring now to FIG. 1 through FIG. 4, an electro-chemical wet etch method is used in order to form porosity in a dielectric film 111 of the flash memory device. For this, a trench type device isolation film 102, a tunnel oxide film 104 and a first floating gate 106 consisting of a first polysilicon film are formed in the semiconductor substrate 100. Next, an oxide film 108 and a silicon nitride film 110 are deposited on the semiconductor substrate 100, thus preparing a wafer W. The wafer W is then mounted on a work cell 120.

At this time, it is preferred that the oxide film 108 is deposited in thickness of about 50 Å through 150 Å. Further, it is preferred that the silicon nitride film 110 is deposited in thickness of about 100 Å through 200 Å. The work cell 120 is designed so that the rear side of the wafer W to be used as a work electrode is applied with a voltage V. Also, the work cell 120 is designed so that a relative electrode 130 and a reference electrode 140 could be immersed in an electrolyte with them kept by a given distance. If the polysilicon film being the first floating gate electrode 106 that is used in a dissociation reaction of silicon is a N-Type, an ultraviolet rays 152 is illuminated on the work electrode in a state where an ultraviolet rays source 150 is located over the work cell 120. The voltage V applied to the work electrode, i.e., the wafer W is about 1.5V through 8V.

The method of forming the ONO dielectric film according to the present invention employs a method of forming porosities by electro-chemical etch. In the method of forming the porosities, a solution in which 49% HF solution and ethanol are mixed is used as the electrolyte 160 and the ultraviolet rays source 150 is used to illuminate the ultraviolet rays 152 of a given wavelength. The work electrode used in electro-chemical etch is the wafer W, exactly the polysilicon film being the floating gate. A hydrogen electrode is used as the reference electrode 140 and a platinum electrode is used as the relative electrode 130. Reaction activation energy necessary in the dissociation reaction of silicon is supplied by applying the voltage V by which silicon can be dissociated to the work electrode. When the dissociation reaction of silicon is generated, an inactive gas such as argon (Ar) is added to the electrolyte 160 and is then bubbled, in order to prevent obstruction of the silicon dissociation reaction due to generation of hydrogen gas, so that hydrogen gas is removed from the reaction surface.

A dissociation mechanism of silicon by electro-chemical etch is as follows.

The surface of silicon that reacts the electrolyte 160 in which HF and ethanol are mixed is saturated with H atoms. Thus, as holes ($h^+$) do not exist on the surface of silicon, the surface is inactive to attack of F_ions. This is because an atmosphere where F-ions can react is not fostered since there is no difference in the electronegativity since the electronegativity of H is 2.2 and the electronegativity of Si is 1.9. If the holes ($h^+$) are supplied by the ultraviolet rays source illuminated on the surface of silicon, nucleophile attack of F-ions becomes possible since the electronegativity of Si becomes relatively lower than that of H atoms.

In case of N type silicon, generation of the holes on the surface of silicon is very important in causing the dissociation process of silicon. If H is substituted by F, the electronegativity of Si is further lowered. Attack of F-ions is further continuously generated.

Hydrogen is generated by those series of reaction. Also, partial dissociation occurs on the surface of silicon by continuous attack of F-ions. Due to this, a new surface is generated. This change causes to change distribution of an electric field on the surface of silicon. The holes are thus supplied from the bulk region, i.e., the bulk region of the silicon nitride film 110 to a portion where silicon is dissociated, by means of this changed electric field. Therefore, the trench is formed in a vertical direction in parallel to the direction from which the holes are supplied. Through this electro-chemical etch, the porosities are formed in the silicon nitride film 110 and/or the oxide film 108 on the first polysilicon film, i.e., the first floating gate 106 serving as the work electrode.

When silicon exists under a positive bias (V) in a dilute HF solution, the current to voltage characteristic region where the porosities may be formed is a low potential. At a high potential, electrical polishing is generated. Also, at an intermediate region (transition region), the reaction in which the porosities are formed by reaction of silicon and HF and the electrical polishing reaction are both generated. Therefore, the important thing in the silicon dissociation process when the voltage by which the porosities may be formed is applied to silicon, is the holes ($h^+$) being a transport medium. Those holes serve to decide the speed of dissociation of silicon. Illuminating the ultraviolet rays when N type silicon is electro-chemically etched, is for sufficiently supplying the holes to the space charge layer on the surface of silicon so that the dissociation reaction can start from the step that silicon starts to dissociate. Meanwhile, silicon and oxygen or OH radical react to form an oxide film (not shown) of below 100 Å on the silicon nitride film 110 in which the porosities are formed. As such, the thickness of the oxide film between the floating gate and the control gate can be reduced using the oxide film on the surface of the silicon nitride film 110 generated during electro-chemical etch, thus increasing capacitance.

When the porosities are formed by the electro-chemical etch method according to the present invention, parameters to control the size of the porosities include the concentration of the electrolyte (volume ratio of HF and ethanol), the intensity of the voltage applied to the work electrode, reaction time, the intensity of the ultraviolet rays source, and so on. Also, parameters to control the depth of the porosities include the intensity of the applied voltage, reaction time, and the like. The electrode area could be controlled by adjusting the size and depth of the porosity using these parameters. In other words, if a second polysilicon film (see '112' in FIG. 5A) to be used as a second floating gate is deposited in a subsequent process, the second polysilicon film is penetrated into the porosities, so that the surface area of the second polysilicon film is increased. This is made possible by controlling the size and depth of the porosity.

Figure 5A:
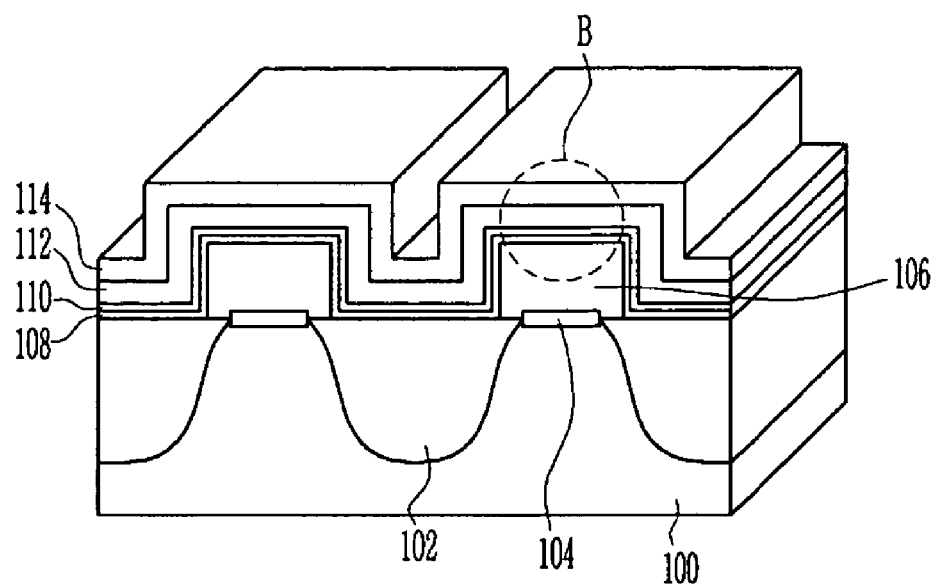
FIG. 5A and FIG. 5B illustrate flash memory cells in which the floating gate and the dielectric film are formed according to a preferred embodiment of the present invention.
Figure 5B:
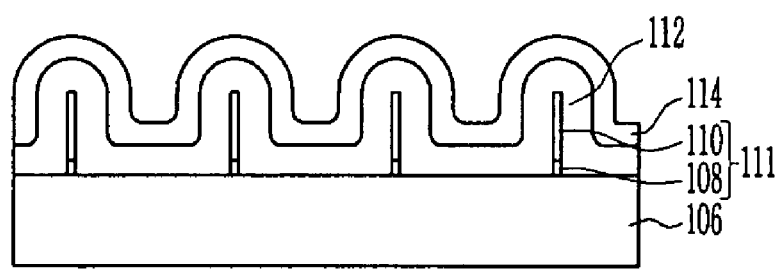

FIG. 5A and FIG. 5B illustrate flash memory cells in which the floating gate and the dielectric film are formed according to a preferred embodiment of the present invention, wherein FIG. 5B is a front view of the flash memory cell illustrating an exaggerated portion of the 'B' portion in FIG. 3A.

Referring now to FIG. 5A and FIG. 5B, after the porosities are formed, the second polysilicon film 112 to be used as the second floating gate is deposited on the silicon nitride film 110. An ONO dielectric film 114, i.e., a dielectric film of a structure on which an oxide film, a silicon nitride film and an oxide film are sequentially stacked is formed. At this time, as the second polysilicon film 112 is penetrated into the porosities, the surface area of the second polysilicon film 112 is increased. Also, the ONO dielectric film 114 is formed along the rugged surface of the second polysilicon film 112. Therefore, as the cross section of the ONO dielectric film 114 is increased, the coupling ratio is increased. Further, it is preferred that the second polysilicon film 112 is formed in thickness of about 50 Å through 200 Å in order to maximize surface charges.

Further, the oxide film 108 and the silicon nitride film 110 having the porosities are formed on the first floating gate 106. Next, the second floating gate and the ONO dielectric film are formed, thus forming a multi capacitor. Therefore, a leakage problem in data can be improved.

As described above, a third polysilicon film (not shown), a silicide film (not shown), a hard mask layer (not shown) and an anti-reflecting coating film (not shown) are deposited on the semiconductor substrate 100 on which the ONO dielectric film 114 is formed. Next, they are patterned to form a gate.

As mentioned above, according to the present invention, the porosities are formed on the first floating gate in order to maximize the electrode area. Therefore, the present invention has advantageous effect that it can satisfy the coupling ratio required in the device. Also, the erase rate of the cell can be increased by increasing the surface area of the ONO dielectric film. Thus, the present invention can improve the operating characteristic of the semiconductor devices and can satisfy the coupling ratio of the ONO dielectric film required when the gate width is reduced as future technologies are advanced. In addition, the multi capacitor formed on the semiconductor substrate serves to prevent data leakage of the floating gate. Therefore, the present invention can attain an improved operating characteristic of the device even in the data storage capacity.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A gate structure in a flash memory cell, comprising:
    a tunnel oxide film formed on a given region of a semiconductor substrate;
    a first floating gate formed on the tunnel oxide film;
    a first dielectric film having a plurality of porosities formed by means of electro-chemical etch, formed on the first floating gate;
    a second floating gate formed on the first dielectric film having the porosities having a rugged surface due to the porosities, wherein the second floating gate contacts the first floating gate through the porosities;
    a second dielectric film formed along the rugged surface on the second floating gate; and
    a control gate formed on the second dielectric film.

2. The gate structure in the flash memory cell as claimed in claim 1, wherein the first dielectric film includes an insulating film of a structure on which an oxide film and a silicon nitride film are sequentially stacked.

3. The gate structure in the flash memory cell as claimed in claim 2, wherein the thickness of the oxide film is about 50 Å through 150 Å and the thickness of the silicon nitride film is about 100 Å through 200 Å.

4. The gate structure in the flash memory cell as claimed in claim 1, wherein the first floating gate and the second floating gate are formed of a polysilicon film.

5. The gate structure in the flash memory cell as claimed in claim 1, wherein the second dielectric film includes an ONO insulating film of a structure on which an oxide film, a silicon nitride film and an oxide film are sequentially stacked.

6. A gate structure in a flash memory cell, comprising:
    a tunnel oxide film formed on a region of a semiconductor substrate;
    a first floating gate formed on the tunnel oxide film;
    an oxide film formed on the first floating gate;
    a silicon nitride film formed on the oxide film, wherein the oxide film and the silicon nitride film include a plurality of porosities formed by means of electro-chemical etch;
    a second floating gate formed on the silicon nitride film having the porosities having a rugged surface due to the porosities, wherein the second floating gate contacts the first floating gate through the porosities;
    a dielectric film formed along the rugged surface on the second floating gate; and
    a control gate formed on the dielectric film.

7. The gate structure in the flash memory cell as claimed in claim 6, wherein the thickness of the oxide film is about 50 Å through 150 Å and the thickness of the silicon nitride film is about 100 Å through 200 Å.

8. The gate structure in the flash memory cell as claimed in claim 6, wherein the first floating gate and the second floating gate are formed of a polysilicon film.

9. The gate structure in the flash memory cell as claimed in claim 6, wherein the dielectric film includes an ONO insulating film of a structure on which an oxide film, a silicon nitride film and an oxide film are sequentially stacked.

* * * * *